(12) United States Patent
Gao et al.

(10) Patent No.: US 11,257,962 B2
(45) Date of Patent: Feb. 22, 2022

(54) TRANSISTORS COMPRISING AN ELECTROLYTE, SEMICONDUCTOR DEVICES, ELECTRONIC SYSTEMS, AND RELATED METHODS

(71) Applicant: Micron Technology, Inc., Boise, ID (US)

(72) Inventors: Yunfei Gao, Boise, ID (US); Kamal M. Karda, Boise, ID (US); Stephen J. Kramer, Boise, ID (US); Gurtej S. Sandhu, Boise, ID (US); Sumeet C. Pandey, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/401,844

(22) Filed: May 2, 2019

(65) Prior Publication Data
US 2020/0350440 A1 Nov. 5, 2020

(51) Int. Cl.
| | |
|---|---|
| *H01L 29/786* | (2006.01) |
| *G11C 13/00* | (2006.01) |
| *H01L 29/16* | (2006.01) |
| *H01L 51/05* | (2006.01) |

(52) U.S. Cl.
CPC ...... *H01L 29/78696* (2013.01); *G11C 13/003* (2013.01); *H01L 29/16* (2013.01); *H01L 29/78603* (2013.01); *H01L 29/78645* (2013.01); *H01L 51/0554* (2013.01)

(58) Field of Classification Search
None
See application file for complete search history.

(56) References Cited

U.S. PATENT DOCUMENTS

| | | | |
|---|---|---|---|
| 7,307,870 B2 | 12/2007 | Kuhr et al. | |
| 9,349,803 B2 | 5/2016 | Meade et al. | |
| 9,525,072 B2 | 12/2016 | Lin et al. | |
| 9,734,906 B2 | 8/2017 | Sills | |
| 9,818,801 B1* | 11/2017 | Rabkin | ............... H01L 27/2409 |
| 9,899,480 B2 | 2/2018 | Seabaugh et al. | |
| 10,033,379 B2 | 7/2018 | Kurokawa et al. | |
| 10,192,161 B1 | 1/2019 | Khan et al. | |
| 2003/0111670 A1 | 6/2003 | Misra et al. | |

(Continued)

FOREIGN PATENT DOCUMENTS

| | | |
|---|---|---|
| KR | 10-2009-0089275 A | 8/2009 |
| KR | 10-2015-0047668 A | 5/2015 |

OTHER PUBLICATIONS

Xu et al., "Monolayer Solid-State Electrolyte for Electric Double Layer Gating of Graphene Field-Effect Transistors," ACS Nano., vol. 11, (2017), pp. 5453-5464.

(Continued)

*Primary Examiner* — Shaun M Campbell
(74) *Attorney, Agent, or Firm* — TraskBritt

(57) ABSTRACT

A transistor comprises a channel region between a source region and a drain region, a dielectric material adjacent to the channel region, an electrode adjacent to the dielectric material, and an electrolyte between the dielectric material (Continued)

and the electrode. Related semiconductor devices comprising at least one transistors, related electronic systems, and related methods are also disclosed.

21 Claims, 8 Drawing Sheets

(56) References Cited

U.S. PATENT DOCUMENTS

| | | | |
|---|---|---|---|
| 2007/0133358 A1* | 6/2007 | Kubo | G11B 9/04 369/13.38 |
| 2009/0042346 A1 | 2/2009 | Kugler | |
| 2009/0225585 A1 | 9/2009 | Hawkins | |
| 2011/0170330 A1 | 7/2011 | Oezyilmaz et al. | |
| 2011/0242726 A1 | 10/2011 | Chan | |
| 2012/0199821 A1* | 8/2012 | Gwoziecki | H01L 51/0554 257/40 |
| 2013/0270533 A1 | 10/2013 | Crispin et al. | |
| 2014/0160852 A1* | 6/2014 | Lee | H01L 29/788 365/185.18 |
| 2014/0319452 A1* | 10/2014 | Seabaugh | H01L 51/0554 257/9 |
| 2015/0108431 A1 | 4/2015 | Kim | |
| 2015/0109048 A1* | 4/2015 | Yang | H01L 29/80 327/430 |
| 2015/0157943 A1* | 6/2015 | Li | A63F 13/35 463/29 |
| 2016/0284811 A1 | 9/2016 | Yu et al. | |
| 2017/0059513 A1 | 3/2017 | Afzali-Ardakani et al. | |
| 2018/0315852 A1 | 11/2018 | Ozkan et al. | |

OTHER PUBLICATIONS

Wang et al., "First-Principles Study of Crown Ether and Crown Ether-Li Complex Interactions with Graphene," The Journal of Physical Chemistry C, vol. 119, (2015), pp. 20016-20022.

Wang et al., "Energetics of Metal Ion Adsorption on and Diffusion Through Crown Ethers: First Principles Study on Two-Dimensional Electrolyte," Solid State Ionics, vol. 301, (2017), pp. 176-181.

Torrejo et al., "Design of Lithium Selective Crown Ethers: Synthesis, Extraction and Theoretical Binding Studies," Chemical Engineering Journal, vol. 326, (2017), pp. 921-933.

Tong et al., "Advances in MoS2-Based Field Effect Transistors (FETs)," Nano-Micro Letters, vol. 7, (2015), pp. 203-218.

Teyssandier et al., "Host-Guest Chemistry in Two-Dimensional Supramolecular Networks," Chemical Communications, vol. 52, (2016), pp. 11465-11487.

Lu et al., "Solution-Cast Monolayers of Cobalt Crown Ether Phthalocyanine on Highly Ordered Pyrolytic Graphite," The Journal of Physical Chemistry C, vol. 119, (2015), pp. 21992-22000.

Gao et al., "A Novel Solid-State Electrolyte Based On a Crown Ether Lithium Salt Complex," Journal of Materials Chemistry A, vol. 3, (2015), pp. 20541-20546.

Ariga et al., "The Chemistry of Molecular Recognition—Host Molecules and Guest Molecules", In: Supramolecular Chemistry—Fundamentals and Applications, Chapter 2, (2006), pp. 7-44.

International Search Report for International Application No. PCT/US2020/028528, dated Jul. 28, 2020, 03 pages.

International Written Opinion for International Application No. PCT/US2020/028528, dated Jul. 28, 2020, 05 pages.

* cited by examiner

TRANSISTORS COMPRISING AN ELECTROLYTE, SEMICONDUCTOR DEVICES, ELECTRONIC SYSTEMS, AND RELATED METHODS

TECHNICAL FIELD

Embodiments disclosed herein relate to transistors, semiconductor devices including the transistors, to electronic systems, and to related methods. More particularly, embodiments of the disclosure relate to transistors including an electrolyte between an electrode and a dielectric material, to related semiconductor devices including the transistors, to related electronic systems, and to related methods.

BACKGROUND

Conventional volatile memory cells, such as dynamic random access memory (DRAM) cells, may include a memory storage element and an access device operably coupled to the memory storage element. The memory storage element may, for example, include a capacitor (e.g., sometimes referred to as a "cell capacitor" or a "storage capacitor") configured to store a logical state (e.g., a binary value of either a "0" or a "1") defined by the stored charge in the capacitor. The access device may include, for example, a diode, a transistor, or another switching device. A transistor conventionally includes a channel region between a pair of source/drain regions and further includes a gate configured to electrically connect the source/drain regions to one another through the channel region. The channel region conventionally includes a semiconductor material, such as silicon.

To charge, discharge, read, or recharge the capacitor, the transistor may be selectively turned to an "on" state, in which current flows between the source region and the drain region through the channel region of the transistor. Application of a voltage greater than a threshold voltage ($V_t$) to the gate induces an inversion layer in the channel region, inducing a current flow between the drain region and the source region. The transistor may be selectively turned to an "off" state, in which the flow of current is substantially stopped.

In the off state, it is desirable for the capacitor associated with the transistor to retain a stored charge, without charge (e.g., leakage thereof) through the transistor. However, conventional volatile memory cells may exhibit discharges of current over time and a resulting loss in stored charge. Therefore, even in the "off" state where the source region and the drain region of the associated transistor are electrically isolated (e.g., when an inversion layer is not present in the channel region and the channel region is not conductive) and the memory cell is unselected (e.g., not selected), current may leak from the capacitor. This off-state current is referred to in the art as sub-threshold leakage current. The undesirable leakage of charge from the capacitor requires the capacitor to be constantly refreshed (e.g., recharged) to maintain the logic state of the memory cell.

In addition to maintaining a low refresh rate, it is desirable for the transistor to exhibit sufficient flow of current (which may be referred to as a drive current) responsive to formation of the inversion layer when the transistor is in the on-state. To accomplish this, the transistor may be formed such that the gate electrode overlaps sufficiently with the source and drain regions (e.g., such that the gate electrode is located proximate the source region and the drain region). As noted above, leakage of current from the capacitor when the transistor is in the off-state is undesired and results in a higher than desired refresh rate of the memory cell.

In addition, fabrication of a memory storage element and an associated access device may require significant real estate in the semiconductor device. Generally, an array of access devices (e.g., transistors) are formed over a substrate. After the access devices are formed, a corresponding array of memory storage elements are formed over the array of access devices. The memory storage elements need to be individually wired to their respective access devices to form a complete memory cell. Not only is the wiring of the memory storage elements to their respective access devices costly, but it also includes significant material and processing costs.

DETAILED DESCRIPTION

Figure 1:
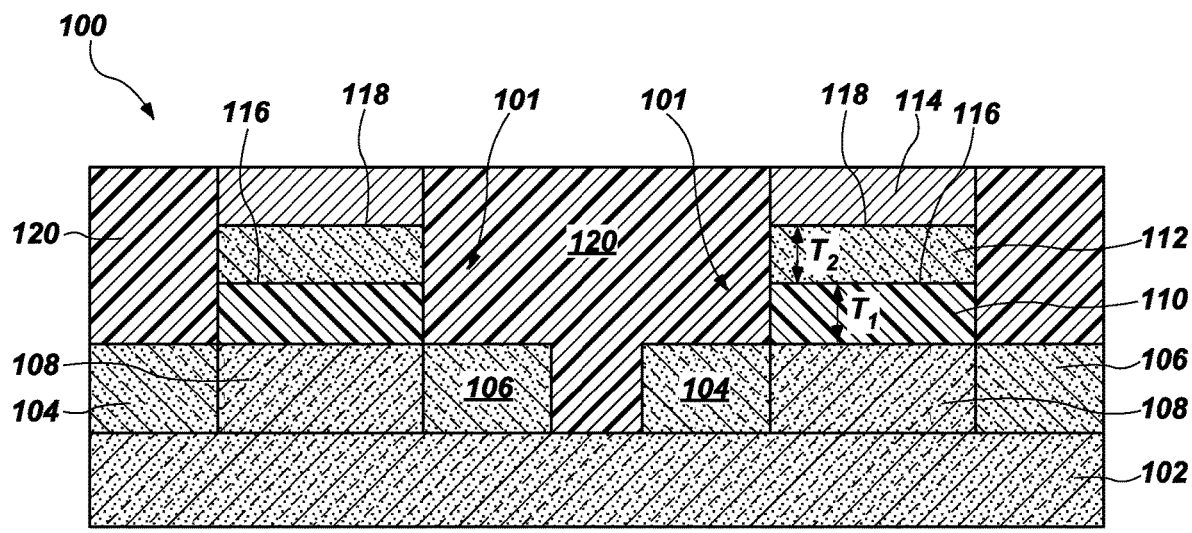
FIG. 1 is a simplified cross-sectional view of a semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a transistor, a semiconductor device including at least one transistor, an electronic system, or a complete description of a process flow for fabricating such transistors, semiconductor devices, or electronic systems. The structures described below do not form complete semiconductor devices. Only those process acts and structures necessary to understand the embodiments described herein are described in detail below. Additional acts to form a complete semiconductor device or an electronic system during fabrication of the semiconductor devices or electronic systems may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

According to embodiments described herein, a transistor includes a channel region between a source region and a drain region. A dielectric material (e.g., a gate dielectric material) may be adjacent to (e.g., on a side of, over) the channel region. An electrolyte (e.g., a solid electrolyte) may be adjacent to (e.g., on a side of, over) the dielectric material and an electrode (e.g., a gate electrode) may be adjacent to (e.g., on a side of, over) the electrolyte. The electrolyte may be directly between the dielectric material and the electrode. In some embodiments, the electrolyte directly contacts both of the dielectric material and the electrode and the dielectric material may be separated from the electrode at least by the electrolyte. The electrolyte may be spaced from the channel region at least by the dielectric material. The electrolyte may comprise a 2D crystalline material, such as a crown ether, a transition metal dichalcogenide, or another material. The electrolyte may include one or more cations (e.g., $Li^+$, $Na^+$, $K^+$, $Be^{2+}$, $Mg^{2+}$, $Sr^{2+}$) formulated and configured to move from one side of the electrolyte to an opposite side of the electrolyte responsive to exposure to an electrical potential. The transistor may be configured as a portion of a memory cell. A logic state of the memory cell may be determined based on an electrical property of the channel region (e.g., a current through the channel region) responsive to application of a voltage to the electrode. The electrical property of the channel region may be dependent on the state of the electrolyte, such as the location of the cations within the electrolyte. Accordingly, a logic state of the memory cell may be determined based on the electrolyte and the memory cell may not include a capacitor memory storage element. In other words, the electrolyte may store the logic state of the memory cell.

FIG. 1 is a simplified cross-sectional view of a semiconductor device 100, in accordance with embodiments of the disclosure. As will be described herein, the semiconductor device 100 may comprise a memory cell, which may not include a capacitor structure, but may comprise a transistor formulated and configured to retain a logic state of the memory cell.

The semiconductor device 100 may include transistors 101 overlying a base material 102. The base material 102 may include a semiconductor substrate, a base semiconductor material on a supporting substrate, a metal electrode, or a semiconductor substrate having one or more materials, structures, or regions formed thereon. The base material 102 may be a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form material, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The transistors 101 may each include a source region 104 and a drain region 106 adjacent to the base material 102. A channel region 108 may be located between the source region 104 and the drain region 106. A dielectric material (e.g., a gate dielectric material) 110 may be located adjacent to (e.g., over) the channel region 108. An electrolyte (e.g., a solid electrolyte) 112 may be located adjacent to (e.g., over) the dielectric material 110. An electrode (e.g., gate electrode) 114 may be located adjacent to the electrolyte 112 and may be separated from the dielectric material 110 by the electrolyte 112. In some embodiments, the electrolyte 112 is directly between the dielectric material 110 and the electrode 114.

The source region 104, the drain region 106, and the channel region 108 may comprise semiconductive materials. In some embodiments, the source region 104, the drain region 106, and the channel region 108 may independently comprise, for example, silicon, polysilicon, germanium, other semiconductive materials, or combinations thereof. The source region 104, the drain region 106, and the channel region 108 may include one or more dopants for altering a conductivity of such regions.

In some embodiments, the source region 104 and the drain region 106 may each individually be formed of and include at least one N-type conductivity material. As used herein, an N-type conductivity material may include, for example, a semiconductive material (e.g., silicon, polysilicon, germanium) doped with at least one N-type dopant (e.g., arsenic ions, phosphorous ions, antimony ions). In other embodiments, the source region 104 and the drain region 106 may each individually be formed of and include at least one P-type conductivity material. As used herein, a P-type conductivity material may include, for example, a semiconductive material (e.g., silicon, polysilicon, germanium) doped with at least one P-type dopant (e.g., boron ions).

The channel region 108 may be formed of and include at least one P-type conductivity material or at least one N-type conductivity material. In some embodiments, the channel region 108 comprises one of a P-type conductivity material and an N-type conductivity material and each of the source region 104 and the drain region 106 individually comprises the other of the P-type conductivity material and the N-type conductivity material.

Thus, in some embodiments, the transistor 101 may comprise an NMOS transistor. In some such embodiments, the source region 104 and the drain region 106 each comprise N-type conductivity materials and the channel region 108 comprises P-type conductivity materials. In some such embodiments, the source region 104 and the drain region 106 may each individually be doped with N-type conductivity materials within a range from about $1\times10^{18}/cm^3$ to about $1\times10^{20}/cm^3$, such as from about $1\times10^{18}/cm^3$ to about $5\times10^{18}/cm^3$, from about $5\times10^{18}/cm^3$ to about $1\times10^{19}/cm^3$, from about $1\times10^{19}/cm^3$ to about $5\times10^{19}/cm^3$, or from about $5\times10^{19}/cm^3$ to about $1\times10^{20}/cm^3$. In some embodiments, each of the source region 104 and the drain region 106 is doped with an N-type conductivity material at about $5\times10^{19}/cm^3$. The channel region 108 may comprise a P-type conductivity material within a range from about $1\times10^{18}/cm^3$ to about $1\times10^{20}/cm^3$, such as from about $1\times10^{18}/cm^3$ to about $5\times10^{18}/cm^3$, from about $5\times10^{18}/cm^3$ to about $1\times10^{19}/cm^3$, from about $1\times10^{19}/cm^3$ to about $5\times10^{19}/cm^3$, or from about $5\times10^{19}/cm^3$ to about $1\times10^{20}/cm^3$. In some embodiments, the channel region 108 comprises about $7\times10^{19}/cm^3$ of the P-type conductivity material.

In other embodiments, each of the source region 104, the drain region 106, and the channel region 108 comprises an N-type conductivity material. In some such embodiments, the source region 104 and the drain region 106 may have a higher concentration of the N-type conductivity material than the channel region 108. For example, the source region 104 and the drain region 106 may have a concentration of the N-type conductivity material of about $5\times10^{19}/cm^3$ and the channel region 108 may have a concentration of the N-type conductivity material of about $1\times10^{18}/cm^3$. In some such embodiments, the transistor 101 comprises an NMOS transistor.

In yet other embodiments, the transistor comprises a PMOS transistor. In some such embodiments, the source region 104 and the drain region 106 may individually comprise at least one P-type conductivity material and the channel region 108 comprises at least one N-type conductivity material. In yet other embodiments, each of the source region 104, the drain region 106, and the channel region 108 comprises a P-type conductivity material. In some such embodiments, the source region 104 and the drain region 106 may have a higher concentration of the P-type conductivity material than the channel region 108. For example, the source region 104 and the drain region 106 may have a concentration of the P-type conductivity material of about $5\times10^{19}/cm^3$ and the channel region 108 may have a concentration of the P-type conductivity material of about $1\times10^{18}/cm^3$.

In yet further embodiments, the channel region 108 may comprise a so-called two-dimensional (2D) crystalline structure. By way of nonlimiting example, the channel region 108 may comprise graphene, a dichalcogenide, such as a transition metal dichalcogenide ($MoS_2$, $MoSe_2$, $MoTe_2$, $WS_2$, $WSe_2$, $WTe_2$, $SnS_2$, $SnSe_2$, $SnTe_2$), black phosphorus, germanene, borophene, phosphorene, $Si_2BN$, or another two-dimensional crystalline material. In some embodiments, the channel region 108 comprises graphene.

As used herein, a transition metal dichalcogenide means and includes a material having the formula MX, such as $MX_2$, wherein M is a transition metal and X is a chalcogen (e.g., sulfur, selenium, or tellurium). The transition metal may include molybdenum, tungsten, niobium, zirconium, hafnium, rhenium, platinum, titanium, tantalum, vanadium, cobalt, cadmium, chromium, or tin. By way of nonlimiting example, transition metal dichalcogenides may include molybdenum sulfide ($MoS_2$), molybdenum selenide ($MoSe_2$), molybdenum telluride ($MoTe_2$), tungsten sulfide ($WS_2$), tungsten selenide ($WSe_2$), tungsten telluride ($WTe_2$), niobium sulfide ($NbS_2$), niobium selenide ($NbSe_2$), niobium telluride ($NbTe_2$), zirconium sulfide ($ZrS_2$), zirconium selenide ($ZrSe_2$), zirconium telluride ($ZrTe_2$), hafnium sulfide ($HfS_2$), hafnium selenide ($HfSe_2$), hafnium telluride ($ZrTe_2$), rhenium sulfide ($ReS_2$), rhenium selenide ($ReSe_2$), rhenium telluride ($ReTe_2$), tin sulfide ($SnS_2$), tin selenide ($SnSe_2$), tin telluride ($SnTe_2$), or combinations thereof.

Adjacent transistors 101 may be electrically isolated from each other by an electrically insulative material 120 which may comprise silicon dioxide, silicon nitride, phosphosilicate glass, borosilicate glass, borophosphosilicate glass, another electrically insulative material, or combinations thereof.

The dielectric material 110 may comprise an electrically insulating material, such as phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride, another dielectric material, a dielectric carbon nitride material (e.g., silicon carbon nitride (SiCN))), a dielectric carboxynitride material (e.g., silicon carboxynitride (SiOCN)), or combinations thereof. In some embodiments, the dielectric material 110 comprises hafnium oxide.

In some embodiments, the dielectric material 110 may have a dielectric constant greater than a dielectric constant of silicon dioxide and may comprise a so-called "high-k" dielectric material. The dielectric material 110 may have a dielectric constant greater than about 5.0, greater than about 10.0, greater than about 15.0, greater than about 20.0, or even greater than about 25.0. In some embodiments, the dielectric material 110 has a dielectric constant of about 22, although the disclosure is not so limited. The dielectric material 110 may be formulated and configured to reduce or prevent charge carriers of the electrolyte 112 from leaking from the electrolyte 112 to the channel region 108. In some embodiments, the band gap of the dielectric material 110 may be greater than about 3.0 eV, such as greater than about 4.0 eV, greater than about 5.0 eV, greater than about 6.0 eV, greater than about 7.0 eV, greater than about 8.0 eV, greater than about 9.0 eV, or even greater than about 10.0 eV.

A thickness $T_1$ of the dielectric material 110 may be within a range from about 10 Å to about 30 Å, such as from about 10 Å to about 15 Å, from about 15 Å to about 20 Å, from about 20 Å to about 25 Å, or from about 25 Å to about 30 Å. In some embodiments, the thickness $T_1$ is about 22 Å. However, the disclosure is not so limited and the thickness $T_1$ may be different than those described.

The electrode 114 may comprise an electrically conductive material. As used herein, an "electrically conductive material" may refer to one or more of a metal, such as tungsten, titanium, nickel, platinum, ruthenium, aluminum, copper, molybdenum, gold, a metal alloy, a metal-containing material (e.g., metal nitrides, metal silicides, metal carbides, metal oxides), a conductively-doped semiconductor material (e.g., conductively-doped silicon, conductively-doped germanium, conductively-doped silicon germanium, etc.), polysilicon, other materials exhibiting electrical conductivity, or combinations thereof. Electrically conductive materials may include at least one of titanium nitride (TiN), tantalum nitride (TaN), tungsten nitride (WN), titanium aluminum nitride (TiAlN), elemental titanium (Ti), elemental platinum (Pt), elemental rhodium (Rh), elemental ruthenium (Ru), elemental molybdenum (Mo), elemental iridium (Ir), iridium oxide ($IrO_x$), elemental ruthenium (Ru), ruthenium oxide ($RuO_x$), elemental tungsten (W), elemental aluminum (Al), elemental copper (Cu), elemental gold (Au), elemental silver (Ag), polysilicon, alloys thereof, or combinations thereof.

The electrolyte 112 may be located between the dielectric material 110 and the electrode 114. In some embodiments, the electrolyte 112 is directly between the dielectric material 110 and the electrode 114 and directly contacts each of the dielectric material 110 and the electrode 114. The electrolyte 112 may contact the dielectric material 110 at an interface 116 between the dielectric material 110 and the electrolyte 112 and may contact the electrode 114 at an interface 118 between the electrode 114 and the electrolyte 112. In some embodiments, the dielectric material 110 does not contact the electrode 114 and the dielectric material 110 is separated from the electrode 114 at least by the electrolyte 112. In some embodiments, the electrolyte 112 is separated from the channel region 108 at least by the dielectric material 110.

The electrolyte 112 may comprise a two-dimensional crystalline structure. In some embodiments, the electrolyte 112 comprises a material formulated and configured such that cations of the electrolyte 112 move from a first end (e.g., from one of the interface 116 and the interface 118) of the electrolyte 112 to a second end (e.g., to the other of the interface 116 and the interface 118) of the electrolyte 112 responsive to exposure to an electric field.

A thickness $T_2$ of the electrolyte 112 may be within a range from about 4 Å to about 10 Å, such as from about 4 Å to about 6 Å, from about 6 Å to about 8 Å, or from about 8 Å to about 10 Å. In some embodiments, the thickness $T_2$ is about 6 Å. In some embodiments, the thickness $T_2$ of the electrolyte 112 may be about one monolayer. However, the disclosure is not so limited and the thickness $T_2$ may be different than those described.

The electrolyte 112 may comprise, for example, a material formulated and configured to host a material (e.g., a cation) that may move within the electrolyte 112 based on, for example, an electrical field (e.g., a potential) to which the electrolyte 112 is exposed. In some embodiments, the electrolyte 112 comprises a so-called "host-guest" complex including a host compound and a guest compound.

By way of nonlimiting example, the electrolyte 112 may comprise a crown ether, which is a class of heterocycle compounds with cyclic oligomers of repeating ethylene-oxy ($-CH_2CH_2-O-$) units. Crown ethers may exhibit tunable cavity sizes and site-selective bonding with metal ions (e.g., cations). As will be described herein, the crown ether may include one or more cations that may diffuse from one side of the crown ether to another side of the crown ether responsive to exposure to an electric field. The crown ether may comprise an ether featuring three or more ether groups in the same rings with any two adjacent ether groups separated by two carbon atoms and may have the chemical formula $(-CH_2CH_2-O-)_n$, wherein n is an integer (e.g., 3, 4, 5, 6, 7, 8, 9, 10, etc.). The size of the cavity of the crown ether may depend on the value of n.

The crown ether may comprise, for example, 3-crown-1 ether (CE1, wherein n is 1), 6-crown-2 ether (CE2, wherein n is 2), 9-crown-3 ether (CE3, wherein n is 3), 12-crown-4 ether (CE4, wherein n is 4), 15-crown-5 ether (CE5, wherein n is 5), 18-crown-6 ether (CE6, wherein n is 6), 21-crown-7 ether (CE7, wherein n is 7), or another crown ether. In some embodiments, the crown ether comprises CE4 or CE5.

Figure 2A:
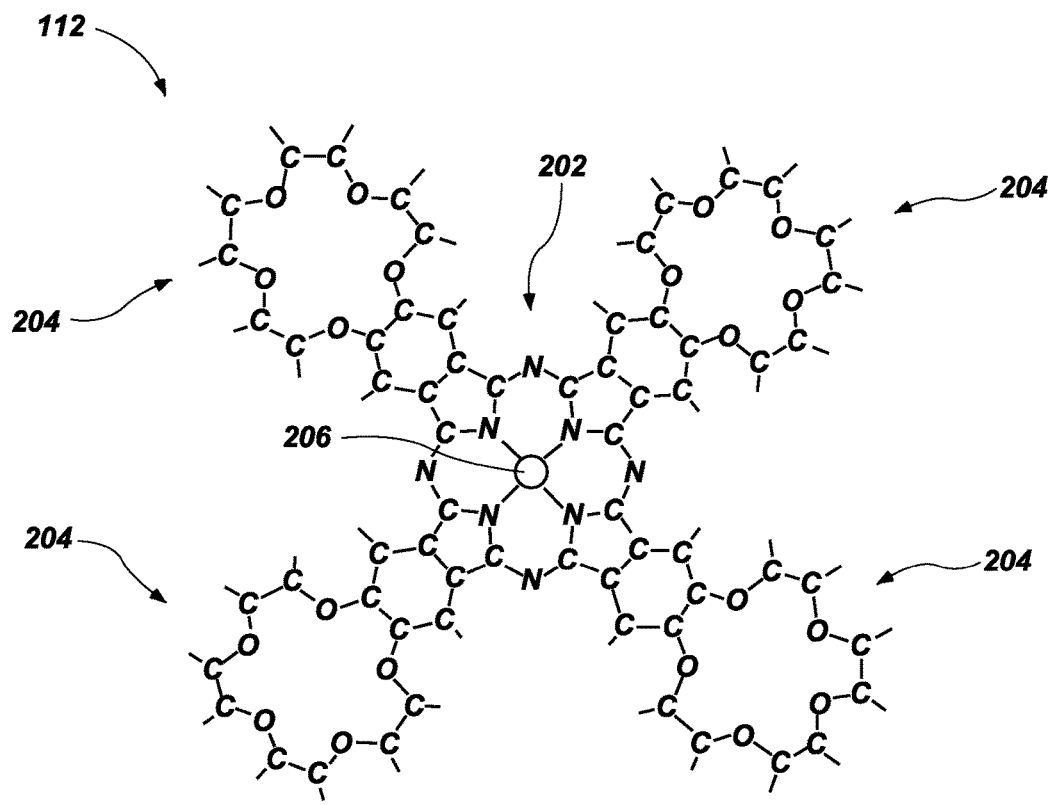
FIG. 2A is a simplified schematic of an electrolyte material, in accordance with embodiments of the disclosure.

The electrolyte 112 may also comprise phthalocyanine. In some such embodiments, the electrolyte 112 comprises phthalocyanine crown ether. For example, with reference to FIG. 2A, the electrolyte 112 (FIG. 1) includes a phthalocyanine molecule 202 surrounded by crown ether molecules 204 (e.g., CE5 molecules). The phthalocyanine molecule 202 may be bonded to four crown ether molecules 204. A metal 206 may coordinate with the phthalocyanine molecule 202. By way of nonlimiting example, the metal 206 may comprise cobalt. In some such embodiments, the electrolyte 112 comprises cobalt crown ether phthalocyanine.

Figure 2B:
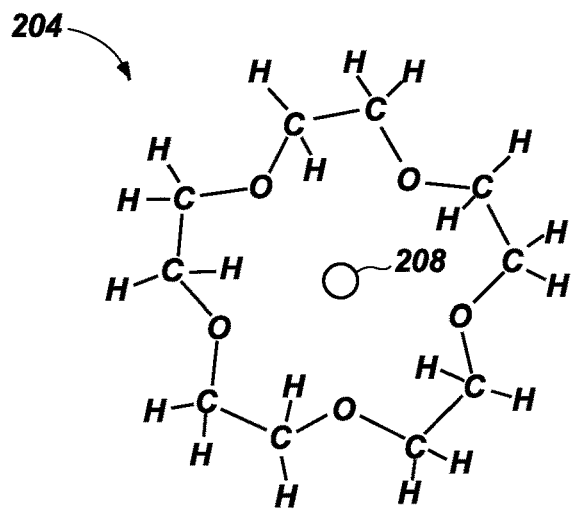
FIG. 2B is a top view of a crown ether, in accordance with embodiments of the disclosure.

FIG. 2B is a top view of a crown ether molecule 204, in accordance with embodiments of the disclosure. The crown ether molecules 204 may each be configured to include (e.g., host) at least one metal cation 208. The metal cation 208 may be hosted within the cavity (opening) of the crown ether molecule 204. The metal cation 208 may be present in the electrolyte 112 as formed.

The metal cation 208 may comprise one or more of lithium ($Li^+$), sodium ($Na^+$), potassium ($K^+$), beryllium ($Be^{2+}$), magnesium ($Mg^{2+}$), calcium ($Ca^{2+}$), strontium ($Sr^{2+}$), or combinations thereof. In some embodiments, the metal cation 208 comprises lithium.

Figure 2C:
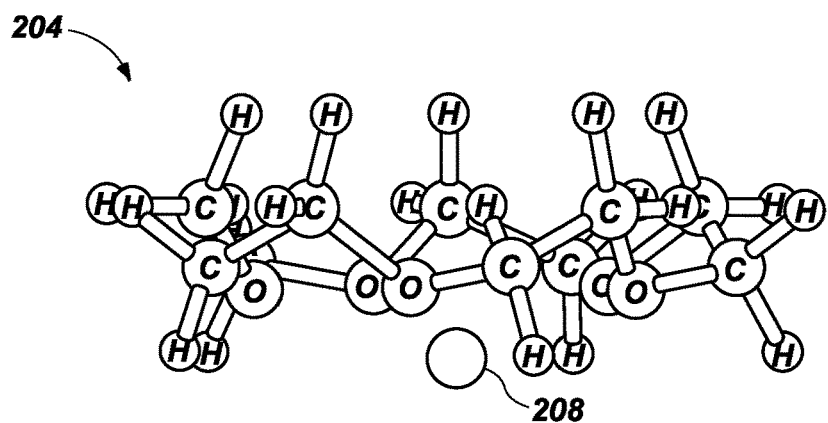
FIG. 2C and FIG. 2D are side views of a crown ether in a respective first configuration and second configuration, in accordance with embodiments of the disclosure.
Figure 2D:
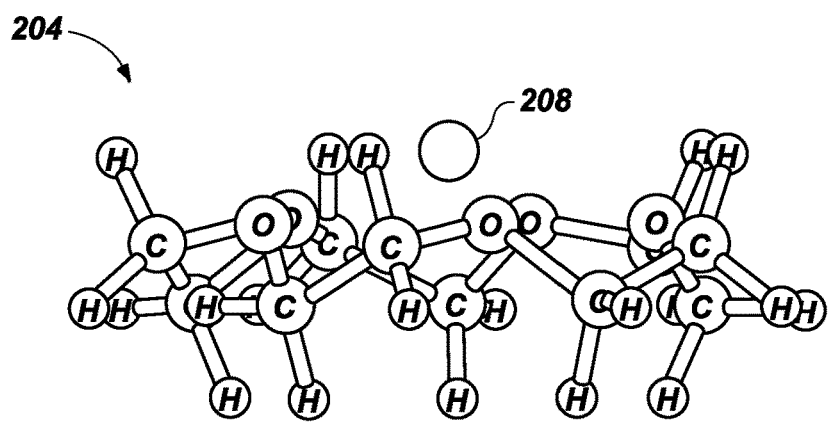

FIG. 2C is a side view of the crown ether molecule 204 in a first orientation and FIG. 2D is a side view of the crown ether molecule 204 in a second orientation, according to embodiments of the disclosure. In the presence of the metal cation 208, the configuration of the crown ether molecule 204 with all of the oxygen atoms located on one side of the molecule may be more stable due to electrostatic attraction between the metal cation 208 and the oxygen atoms. Depending on an applied electrical field to which the crown ether molecule 204 is exposed, the metal cation 208 may be transported (e.g., diffuse, move) through the opening of the crown ether molecule 204 from one side (e.g., one of a top or a bottom) thereof to the other side (e.g., the other of the top or the bottom) thereof. Due to strong interactions (e.g., binding) between the metal cation 208 and the oxygen atoms of the crown ether molecule 204, when the metal cation 208 moves from one side to another side of the crown ether molecule 204, the crown ether molecule 204 may change its own configuration such that the oxygen atom sites reverse their location.

With reference to FIG. 2C and FIG. 2D, depending on an orientation of an electric field (e.g., a potential applied across the electrolyte 112) to which the electrolyte 112 (FIG. 1) is exposed, the metal cations 208 within the electrolyte 112 may drift through the electrolyte 112, such as from a first side thereof to a second side thereof. For example, the metal cations may drift from the interface 116 between the electrolyte 112 and the dielectric material 110 to the interface 118 between the electrolyte 112 and the electrode 114 or vice versa.

In some embodiments, the electrolyte 112 may be formed by drop casting an alkali or alkaline salt (e.g., $LiClO_4$) on a cobalt crown ether phthalocyanine surface, followed by annealing. In other embodiments, the electrolyte 112 may be formed by mixing a liquid state crown ether (crown ether phthalocyanine) with lithium iodide, followed by drying, annealing, or both. However, the disclosure is not so limited and the electrolyte 112 may be formed by other methods.

Although the electrolyte 112 has been described as comprising cobalt crown ether phthalocyanine, the disclosure is not so limited. In other embodiments, the electrolyte 112 comprises a dibenzo crown ether (e.g., dibenzo-14-crown-4 ether, didecalino-14-crown-4 ether, decalino-14-crown-4 ether), a cyclodextrin, a calixarene, benzene-1,3,5-tricarboxylic acid (trimesic acid (TMA)), 1,3,5-tris(4-carboxyphenyl) benzene (BTB), 1,3,5-tris[4'-carboxy(1,1'-biphenyl-4-yl) benzene] (TCBPB), a triangular phenylene-ethynylene macrocycle (DBA) (e.g., DBA-OC10, DBA-OC14, DBA-OC20, DBA-OC30), a dicarbonitrilepolyphenylene (NC-Phn-CN, wherein n is the number of phenyl groups and may comprise, for example, 3, 4, 5, 6), a metal carboxylate (e.g., iron carboxylate of terephthalic acid (TPA), iron carboxylate of 4,1',4'1''-terphenyl-1,4''-dicarboxylic acid (TDA)), ringed structures including boroxine rings connected by benzene rings, hexagonal boron nitride, cyclothiophene macrocycle, a tricarbazolo triazolophane macrocycle, pentacyanopentabenzo[25]annulene (cyanostar), a cyclic porphyrin polymer, cyclic derivatives of quaterphneyl tetracarboxylic acid (QPTC), and other shape-persistent macrocycles.

Referring back to FIG. 1, in use and operation, a write operation may be performed by applying a voltage (e.g., a write voltage) to the electrode 114 to induce movement (drift) of cations (e.g., cations 208) within the electrolyte 112 from one of the interfaces 116, 118 to the other of the interfaces 116, 118. For example, application of a positive voltage may induce movement of the cations to the interface 118 between the electrolyte 112 and the electrode 114 and application of a negative voltage may induce movement of the cations to the interface 116 between the electrolyte 112 and the dielectric material 110.

The logic state of the semiconductor device 100 (e.g., of the transistor 101) may be determined based on the conductivity of the channel region 108. The conductivity of the channel region 108 may be related to the location of the cations within the electrolyte 112 (e.g., whether the cations are located proximate the interface 116 or proximate the interface 118). For example, when the cations are located proximate the interface 118, for the same voltage applied to the electrode 114, the current measured at the drain (such as through a bit line) may be less than a current measured at the drain when the cations are located proximate the interface 116 at the same voltage applied to the electrode 114.

Therefore, in some embodiments, a read operation may be performed, which includes determining a conductivity of the channel region 108. The read operation may be performed by applying, to the electrode 114, a voltage (e.g., a read voltage) having a lower magnitude than the write voltage applied during the write operation and determining a current at the drain region 106.

In some embodiments, an erase operation may be performed by applying an opposite bias to the electrode 114 as a bias applied during a read operation. Applying the opposite bias may induce movement of the cations in the electrolyte 112 in a direction opposite the direction the cations move during the write operation.

In some embodiments, the electrolyte 112 between the dielectric material 110 and the electrode 114 may facilitate improved operation of the semiconductor device 100 compared to conventional semiconductor devices. In some embodiments, the dielectric material 110 may exhibit a band gap such that leakage through the channel region 108 is reduced compared to that of conventional semiconductor devices that do not include an electrolyte in direct physical contact with a channel region. Placing the dielectric material 110 between the electrolyte 112 and the channel region 108 may reduce leakage of ions or charge carriers through the channel region 108. In addition, the dielectric material 110 may exhibit a relatively high dielectric constant, facilitating improved writing efficiency (such as by increasing the capacitance and the associated drive current). Further, the dielectric material 110 may exhibit a dielectric constant such that the write voltage (the voltage applied to the electrode 114 during a programming operation) is reduced. The reduced write voltage may facilitate improved performance of the transistors 101, even if the dielectric constant of the electrolyte 112 increases during switching. The transistors 101 may exhibit a read window ($V_{tcc}$), defined as a difference in a voltage at the electrode 114 when the metal cations 208 of the electrolyte 112 are at a first side of the electrolyte 112 compared to when the metal cations 208 are on a second side of the electrolyte 112, greater than about 1.1 V. In some embodiments, the read window is between about 1.1 V and about 1.2 V, such as about 1.17 V.

The semiconductor device 100 may be formed by forming a channel region between a source region and a drain region. The channel region may be doped with an impurity at a different concentration than the source region and the drain region. A dielectric material may be formed over the channel region. The dielectric material may be formed by ALD, CVD, PVD, PECVD, LPCVD, another method, or combinations thereof. An electrolyte may be formed over the dielectric material. The electrolyte may be formed over the dielectric material in-situ or may be formed ex-situ and positioned over the dielectric material. The electrolyte may be formed as described above with reference to the electrolyte 112. An electrode may be formed over the electrolyte by ALD, CVD, PVD, PECVD, LPCVD, another method, or combinations thereof. The electrolyte may be located between the electrode and the dielectric material. In addition, the electrolyte may be spaced from the channel region by the dielectric material.

Figure 3A:
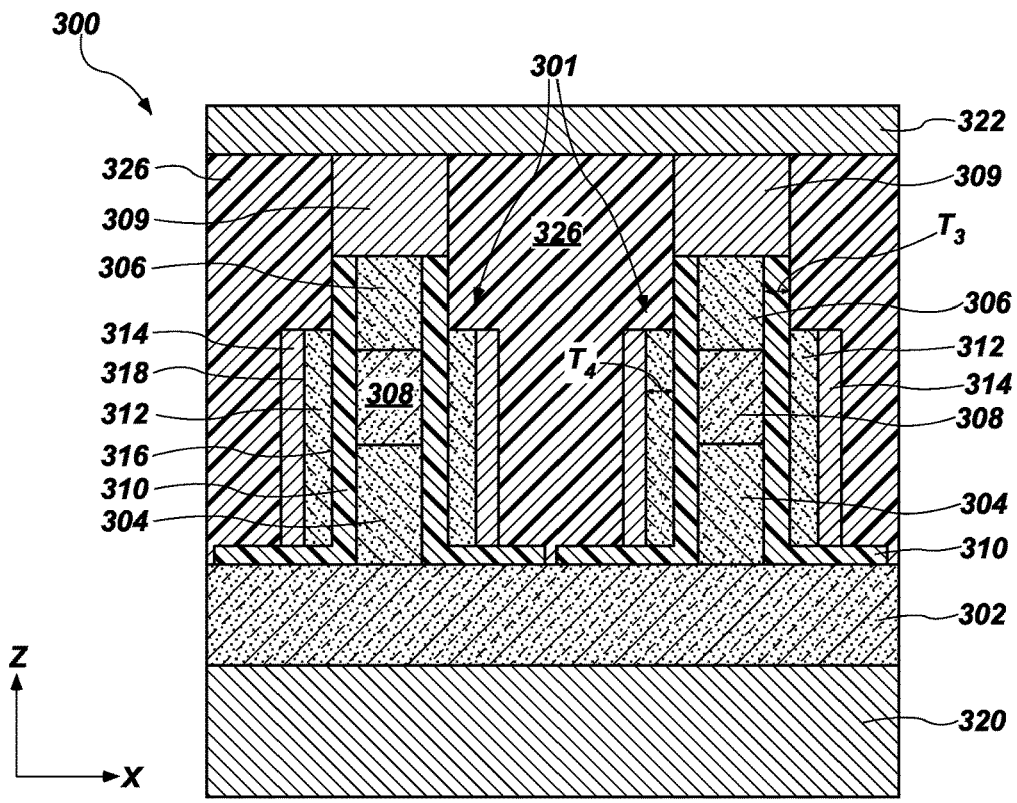
FIG. 3A and FIG. 3B are simplified cross-sectional views of a semiconductor device, in accordance with embodiments of the disclosure.
Figure 3B:
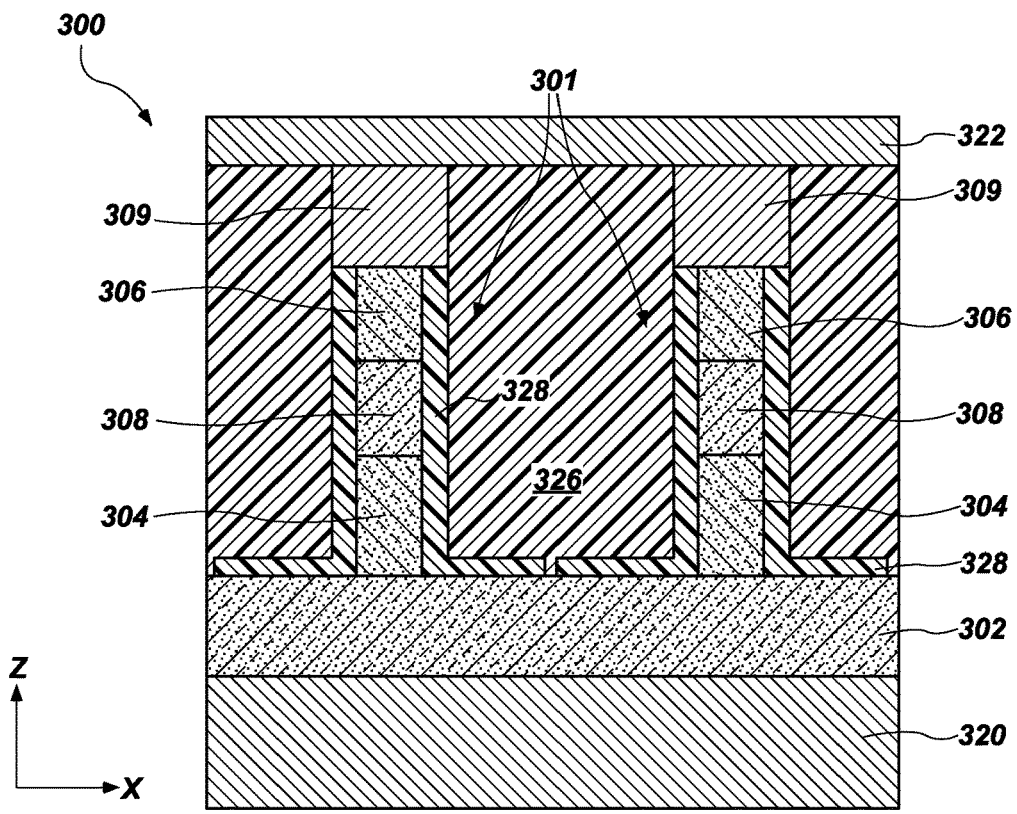

FIG. 3A and FIG. 3B are simplified cross-sectionals view of a semiconductor device 300, in accordance with embodiments of the disclosure. The semiconductor device 300 may include similar components as the semiconductor device 100 described above with reference to FIG. 1, but may include transistors 301 that are vertically oriented with respect to a major surface of a base material 302. Since the transistors 301 are vertically oriented, the transistors 301 may, in some embodiments, be referred to as vertical transistors.

Adjacent transistors 301 may be electrically isolated from each other by a dielectric material 326, which may comprise silicon dioxide, silicon nitride, phosphosilicate glass, borosilicate glass, borophosphosilicate glass, another electrically insulative material, or combinations thereof.

The semiconductor device 300 includes the base material 302 comprising a semiconductive material, which may also be referred to as a so-called "body" material. The base material 302 may be substantially the same as the base material 102 described above. The base material 302 may be in electrical communication with a drain region 304, which in turn, may be in electrical communication with a channel region 308. The channel region 308 may be located between (e.g., vertically between), the drain region 304 and a source region 306.

The drain region 304, the source region 306, and the channel region 308 may comprise the same materials described above with reference to the source region 104, the drain region 106, and the channel region 108.

A first conductive line 320 may be adjacent to the base material 302. The first conductive line 320 may comprise an electrically conductive material. In some embodiments, the first conductive line 320 comprises tungsten, but the disclosure is not so limited. The first conductive line 320 may be referred to herein as a bit line. In some embodiments, the first conductive line 320 is electrically coupled to the drain region 304 through the base material 302.

A source contact 309 may be adjacent to the source region 306. The source contact 309 may comprise an electrically conductive material. In some embodiments, the source contact 309 comprises tungsten. In other embodiments, the source contact 309 comprises polysilicon. However, the disclosure is not so limited and the source contact 309 may comprise other materials.

A second conductive line 322 may be adjacent to (e.g., overlie, overlie a sidewall of) the source contact 309 and may be in electrical communication with the source contact 309. The second conductive line 322 may comprise an electrically conductive material. In some embodiments, the second conductive line 322 comprises the same material as the first conductive line 320.

With reference to FIG. 3B, a liner material 328 may be adjacent to the vertical transistors 301 in the y-direction. The liner material 328 may comprise an electrically insulative material. By way of nonlimiting example, the liner material 328 comprises silicon dioxide, silicon nitride, phosphosilicate glass, borosilicate glass, borophosphosilicate glass, another electrically insulative material, or combinations thereof.

A dielectric material (e.g., a gate dielectric material) 310 may be adjacent to (e.g., overlie, overlie a sidewall of) at least the channel region 308. In some embodiments, the dielectric material 310 is also adjacent to the drain region 304, the source region 306, or both of the drain region 304 and the source region 306. In some embodiments, the dielectric material 310 is adjacent to (overlies) the base material 302. The dielectric material 310 may comprise one or more of the same materials described above with reference to the dielectric material 110. A thickness $T_3$ of the dielectric material 310 may be substantially the same as the thickness $T_1$ of the dielectric material 110 described above.

An electrolyte 312 is adjacent to the dielectric material 310. The electrolyte 312 may comprise one or more of the same materials described above with reference to the electrolyte 112. A thickness $T_4$ of the electrolyte 312 may be substantially the same as the thickness $T_2$ of the electrolyte 112 described above.

An electrode (e.g., a gate electrode) 314 may be adjacent to the electrolyte 312. The electrode 314 may comprise an electrically conductive material, such as one or more of the materials described above with reference to the electrode 114.

The electrolyte 312 may be located directly between the dielectric material 310 and the electrode 314. In some embodiments, the electrolyte 312 is directly between the dielectric material 310 and the electrode 314 and directly contacts each of the dielectric material 310 and the electrode 314. The electrolyte 312 may contact the dielectric material 310 at an interface 316 between the dielectric material 310 and the electrolyte 312. The electrolyte 312 may also contact the electrode 314 at an interface 318 between the electrode 314 and the electrolyte 312. In some embodiments, the dielectric material 310 does not contact the electrode 314 since the electrolyte 312 is directly between the dielectric material 310 and the electrode 314, at least at a portion of the electrolyte 312 proximate the channel region 308. In other words, the electrolyte 312 may be directly between the dielectric material 310 and the electrode 314 at least proximate the channel region 308. In some embodiments, the electrolyte 312 is separated from the channel region 308 at least by the dielectric material 310.

As discussed above with reference to the electrolyte 112, the electrolyte 312 may include one or more metal cations, a location of which may be dependent on an orientation of the oxygen atoms of the crown ether. The metal cations may include for example, lithium, sodium, potassium, beryllium, magnesium, calcium, strontium, or combinations thereof. In some embodiments, the metal cations comprise lithium. Depending on the orientation of an electric field (e.g., a potential applied across the electrolyte 312), the metal cations within the electrolyte 312 may drift through the electrolyte 312, such as from a first side thereof to a second side thereof. For example, the metal cations may drift from the interface 316 between the electrolyte 312 and the dielectric material 310 to the interface 318 between the electrolyte 312 and the electrode 314 or vice versa.

In use and operation, a write operation may be performed by applying a voltage (a write voltage) to the electrode 314 to induce movement (drift) of the cations within the electrolyte 312 to one of the interfaces 316, 318. For example, application of a positive voltage may induce movement of the cations to the interface 318 between the electrolyte 312 and the electrode 314 and application of a negative voltage may induce movement of the cations to the interface 316 between the electrolyte 312 and the dielectric material 310.

As described above with respect to the semiconductor device 100, the logic state of a transistor 301 may be determined based on the conductivity of the channel region 308. The conductivity of the channel region 308 may be related to the location of the cations within the electrolyte 312 (e.g., whether the cations are located proximate the interface 316 or the interface 318). For example, when the cations are located proximate the interface 318, the current measured at the drain (such as through a bit line) may be less than when the cations are located proximate the interface 316 at the same voltage (read voltage) applied to the electrode 314.

An erase operation may be performed by applying an opposite bias to the electrode 314 as that applied during a read operation. Applying the opposite bias may induce movement of the cations in the electrolyte 312 in a direction opposite the direction the cations move during the write operation.

In some embodiments, the electrolyte 312 between the dielectric material 310 and the electrode 314 may facilitate improved operation of the semiconductor device 300 compared to conventional semiconductor devices. In some embodiments, dielectric material 310 may exhibit a band gap such that leakage through the channel region 308 is reduced compared to conventional semiconductor devices that may include an electrolyte directly contacting the channel region 308. Placing the dielectric material 310 between the electrolyte 312 and the channel region 308 may reduce leakage of ions or charge carriers through the channel region 308. In addition, the dielectric material 310 may exhibit a relatively high dielectric constant, facilitating improved writing efficiency (such as by increasing the capacitance and the associated drive current).

The semiconductor device 300 may be formed by forming one of a source material and a drain material over a base material. A channel material may be formed over the one of the source material and the drain material. The other of the source material and the drain material may be formed over the channel material. The source material, drain material, and channel material may be patterned to form pillars comprising a source region, a drain region, and a channel region. A dielectric material may be formed adjacent sidewalls of at least the channel regions. An electrolyte may be formed adjacent the dielectric material and an electrode may be formed adjacent the electrolyte. The electrolyte may be formed adjacent to the dielectric material in-situ or may be formed ex-situ and subsequently positioned adjacent to the dielectric material. The dielectric material and the electrode may be formed by ALD, CVD, PVD, PECVD, LPCVD, another method, or combinations thereof. The electrolyte may be formed as described above with reference to the electrolyte 112. The electrolyte may be located between the dielectric material and the electrode. The electrolyte may be spaced from the channel region by the dielectric material.

Although the semiconductor device 300 of FIG. 3 has been described and illustrated as comprising so-called "double gate" transistors including the electrode 314 on two opposing sides of the vertical transistors 301, the disclosure is not so limited. In other embodiments, the semiconductor device 300 may comprise so-called "single gate" transistors, "gate all around" transistors, or other transistors.

Figure 4A:
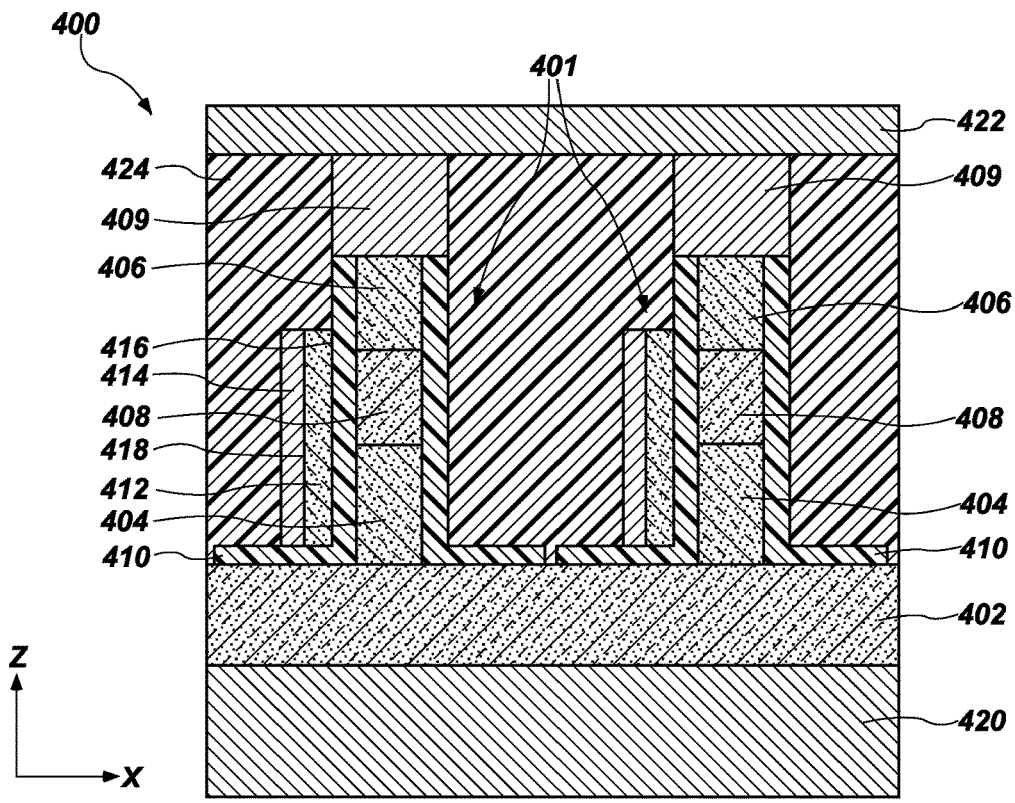
FIG. 4A and FIG. 4B are simplified cross-sectional views of a semiconductor device, in accordance with other embodiments of the disclosure.
Figure 4B:
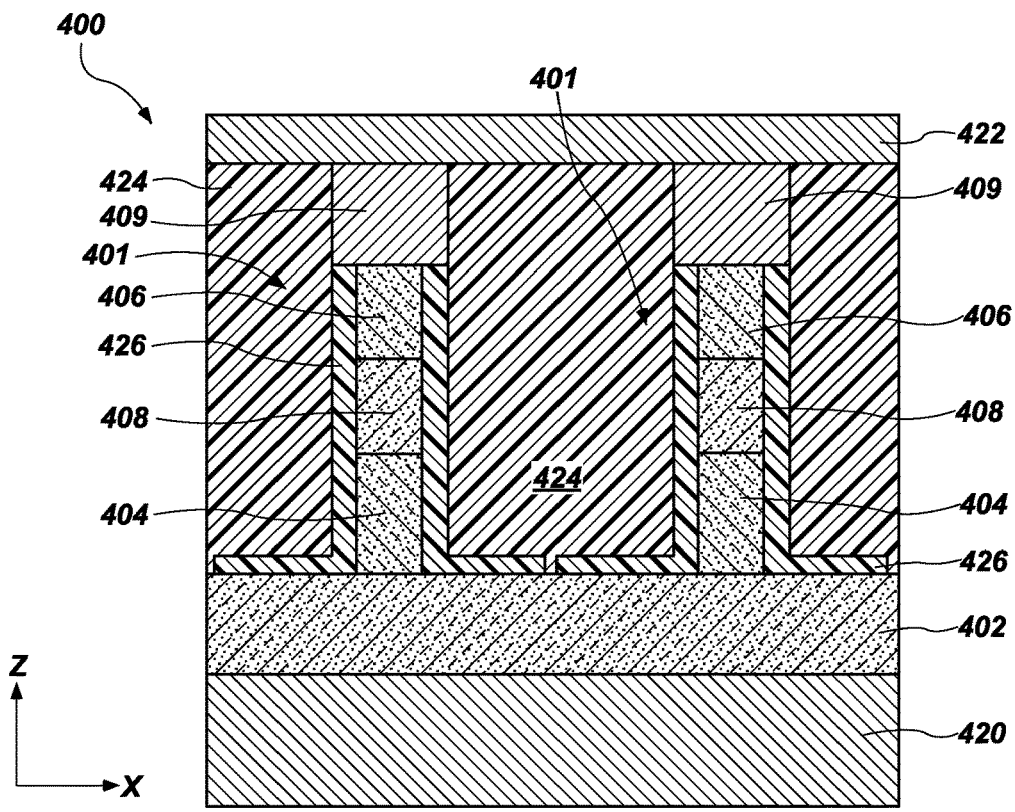

FIG. 4A and FIG. 4B are simplified cross-sectional views of a portion of a semiconductor device 400 including vertical transistors 401 arranged as single gate transistors, in accordance with embodiments of the disclosure. Referring to FIG. 4A, a portion of a semiconductor device 400 including a vertical transistor 401 is illustrated. The vertical transistors 401 may each include a drain region 404, a channel region 408 over the drain region 404, and a source region 406 over the channel region 408. The vertical transistor 401 overlies a base material 402, which may be substantially the same as the base material 302 described above with reference to FIG. 3A. A source contact 409 may overlie the source region 406.

The base material 402 may overlie a first conductive line 420. A second conductive line 422 may overlie and be in electrical communication with the source contact 409. The first conductive line 420 and the second conductive line 422 may be substantially the same as the respective first conductive line 320 and second conductive line 322 described above with reference to FIG. 3A and FIG. 3B. With reference to FIG. 4A, the dielectric material 410 may be located on only one side of the vertical transistors 401. In other words, the dielectric material 410 may be adjacent to only one side of the channel region 408. As such, the vertical transistors 401 may be referred to as so-called "single-gate" transistors.

A dielectric material (e.g., a gate dielectric material) 410 may be adjacent to (e.g., on a side of) at least a portion of the channel region 408. In some embodiments, the dielectric material 410 is adjacent to the drain region 404 and the source region 406. In some embodiments, the dielectric material 410 may extend from the drain region 404 to the source region 406. The dielectric material 410 may also be adjacent to (e.g., over) the base material 402. The dielectric material 410 may comprise the same materials described above with reference to the dielectric material 310.

An electrolyte 412 may be adjacent to (e.g., on a side of) the dielectric material 410. The electrolyte 412 may be substantially the same as the electrolyte 312 described above with reference to FIG. 3A and FIG. 3B. In some embodiments, the electrolyte 412 comprises cobalt crown ether phthalocyanine.

The electrolyte 412 may be adjacent to the dielectric material 410 and may, in some embodiments, be coextensive with the dielectric material 410. In other embodiments, the dielectric material 410 may extend farther from the base material 402 than the electrolyte 412 extends from the base material 402. In some embodiments, the electrolyte 412 may be adjacent to (overlie a side of) at least the dielectric material 410, such as the portion of the dielectric material 410 adjacent to the channel region 408. In some embodiments, the electrolyte 412 extends from at least the drain region 404 to at least the source region 406.

An electrode (e.g., a gate electrode) 414 may be adjacent to (e.g., overlie a side of) the electrolyte 412. The electrode 414 may be substantially the same as the electrode 314 described above. The electrode 414 may be coextensive with the electrolyte 412. The electrolyte 412 may be located between the electrode 414 and the dielectric material 410. In some embodiments, the electrolyte 412 is directly between and contacts each of the electrode 414 and the dielectric material 410. For example, the electrolyte 412 may contact the dielectric material 410 at interface 416 between the dielectric material 410 and the electrolyte 412. The electrolyte 412 may also contact the electrode 414 at interface 418 between the electrode 414 and the electrolyte 412. In some embodiments, the dielectric material 410 does not contact the electrode 414 since the electrolyte 412 is directly between the dielectric material 410 and the electrode 414, at least proximate the channel region 408. In some embodiments, the electrolyte 412 is separated from the channel region 408 at least by the dielectric material 410.

A dielectric material 424 may be located between adjacent vertical transistors 401 and may electrically isolate adjacent vertical transistors 401 from one another. The dielectric material 424 may be substantially the same as the dielectric material 326 described above with reference to FIG. 3A and FIG. 3B.

Referring to FIG. 4B, a liner material 426 may be adjacent to the vertical transistors 401 in the y-direction. The liner material 426 may be substantially the same as the liner material 328 described above.

In use and operation, a logic state of a vertical transistor 401 may be determined based on the conductivity of the channel region 408. The conductivity of the channel region 408 may be related to the location of the cations within the electrolyte 412 (e.g., whether the cations are located proximate the interface 416 or the interface 418). For example, when the cations are located proximate the interface 418, the current measured at the drain (such as through a bit line) may be less than when the cations are located proximate the interface 416 at the same voltage (read voltage) applied to the electrode 414.

An erase operation may be performed by applying an opposite bias to the electrode 414 as that applied during a read operation. Applying the opposite bias may induce movement of the cations in the electrolyte 412 in a direction opposite the direction the cations move during the write operation.

The semiconductor device 400 may be formed in a similar manner as the semiconductor device 300, except that the dielectric material 410, the electrolyte 412, and the electrode 414 may be formed adjacent only one side of the channel region 408.

Figure 5A:
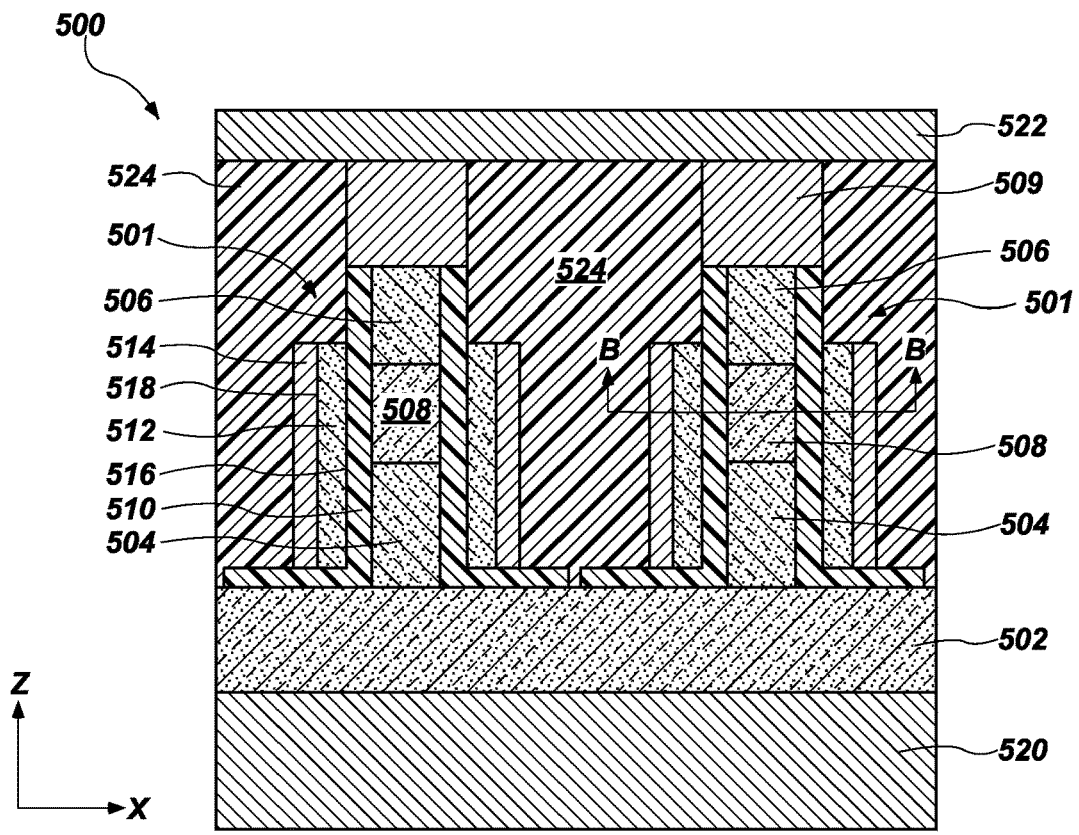
FIG. 5A is a simplified cross-sectional view of a semiconductor device, in accordance with embodiments of the disclosure.
Figure 5B:
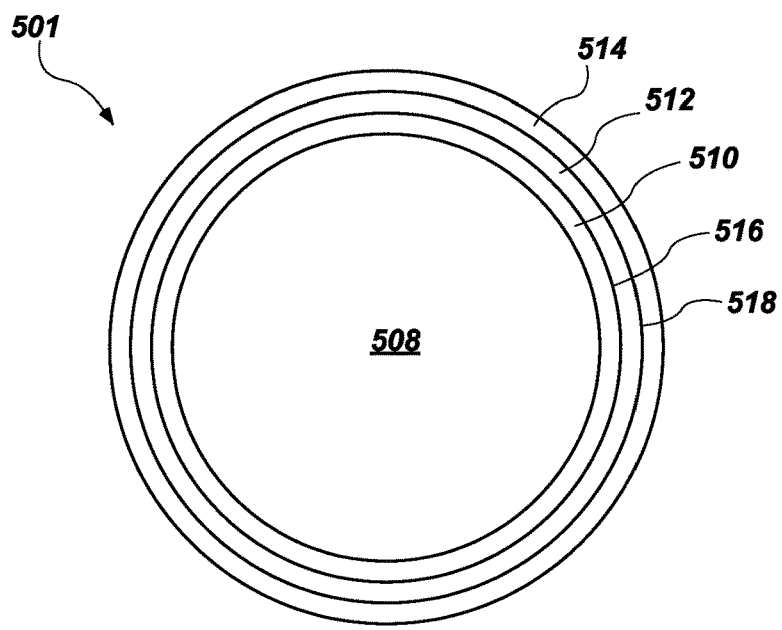
FIG. 5B is a simplified cross-sectional view of a vertical transistor of FIG. 5A taken through section line B-B.

FIG. 5A is a respective simplified cross-sectional view of a semiconductor device 500 including vertical transistors 501 arranged as gate all around (GAA) transistors, in accordance with embodiments of the disclosure. FIG. 5B is a top cross-sectional view of one of the vertical transistors 501 taken through section line B-B of FIG. 5A. The semiconductor device 500 includes vertical transistors 501 including a drain region 504, a channel region 508 over the drain region 504, and a source region 506 over the channel region 508. The vertical transistors 501 overlie a base material 502, which may be substantially the same as the base material 302 described above with reference to FIG. 3A and FIG. 3B. A source contact 509 may overlie the source region 506 and comprises an electrically conductive material.

The base material 502 may overlie a first conductive line 520. A second conductive line 522 may overlie and be in electrical communication with the source contact 509. The first conductive line 520 and the second conductive line 522 may be substantially the same as the respective first conductive line 520 and second conductive line 522 described above with reference to FIG. 3A and FIG. 3B.

A dielectric material (e.g., a gate dielectric material) 510 may be adjacent to (overlie a side of) at least a portion of the channel region 508. In some embodiments, the dielectric material 510 is adjacent to the drain region 504 and the source region 506. In other words, the dielectric material 510 may extend from the drain region 504 to the source region 506. In some embodiments, the dielectric material 510 may also be adjacent to (e.g., overlie) the base material 502 between adjacent vertical transistors 501. The dielectric material 510 may comprise the same materials described above with reference to the dielectric material 310.

FIG. 5B is a cross-sectional view of the vertical transistor 501 taken through section line B-B of FIG. 5A. With reference to FIG. 5A and FIG. 5B, the dielectric material 510 may be located on all sides of the vertical transistors 501. In other words, the dielectric material 510 may substantially surround all sides of the vertical transistors 501. With reference to FIG. 5B, a cross-sectional shape of the dielectric material 510 is substantially circular. In other embodiments, the cross-sectional shape of the dielectric material 510 is substantially square or rectangular.

An electrolyte 512 may be adjacent to (e.g., overlie sides of) the dielectric material 510. The electrolyte 512 may be substantially the same as the electrolyte 312 described above with reference to FIG. 3A and FIG. 3B. In some embodiments, the electrolyte comprises cobalt crown ether phthalocyanine. In some embodiments, the electrolyte 512 substantially surrounds the dielectric material 510.

An electrode (e.g., a gate electrode) 514 may be adjacent to (e.g., overlie sides of) the electrolyte 512. The electrolyte 512 may be located between the electrode 514 and the dielectric material 510. In some embodiments, the electrolyte 512 is directly between and contacts each of the electrode 514 and the dielectric material 510. For example, the electrolyte 512 may contact the dielectric material 510 at an interface 516 between the dielectric material 510 and the electrolyte 512. The electrolyte 512 may also contact the electrode 514 at an interface 518 between the electrode 514 and the electrolyte 512. In some embodiments, the dielectric material 510 does not contact the electrode 514 since the electrolyte 512 is directly between the dielectric material 510 and the electrode 514.

A dielectric material 524 may be located between adjacent vertical transistors 501 and may electrically isolate adjacent vertical transistors 501 from one another. The dielectric material 524 may be substantially the same as the dielectric material 326 described above with reference to FIG. 3A and FIG. 3B.

Operation of the semiconductor device 500 may be substantially similar to operation of the semiconductor devices 300, 400 described above.

The semiconductor device 500 may be formed in a similar manner as the semiconductor device 300, except that the dielectric material 510, the electrolyte 512, and the electrode 514 may be formed adjacent only one side of the channel region 508.

Accordingly, in at least some embodiments, a transistor comprises a channel region between a source region and a drain region, a dielectric material adjacent to the channel region, an electrode adjacent to the dielectric material, and an electrolyte between the dielectric material and the electrode.

Accordingly, in at least additional embodiments, a semiconductor device comprises at least one transistor. The at least one transistor comprises an electrolyte between a dielectric material and an electrode, and a channel region adjacent to the dielectric material.

Accordingly, a method of forming a semiconductor device comprises forming a channel region between a source region and a drain region, forming a dielectric material adjacent at least the channel region, forming an electrolyte adjacent the dielectric material; and, forming an electrode adjacent the electrolyte and spaced from the dielectric material by the electrolyte.

Accordingly, in at least some embodiments, a method of operating a semiconductor device comprises applying a first voltage to an electrode adjacent an electrolyte to move cations to one of an interface between the electrode and the electrolyte or an interface between the electrolyte and a dielectric material, and determining at least one electrical property of a channel region separated from the electrolyte by the dielectric material.

Figure 6:
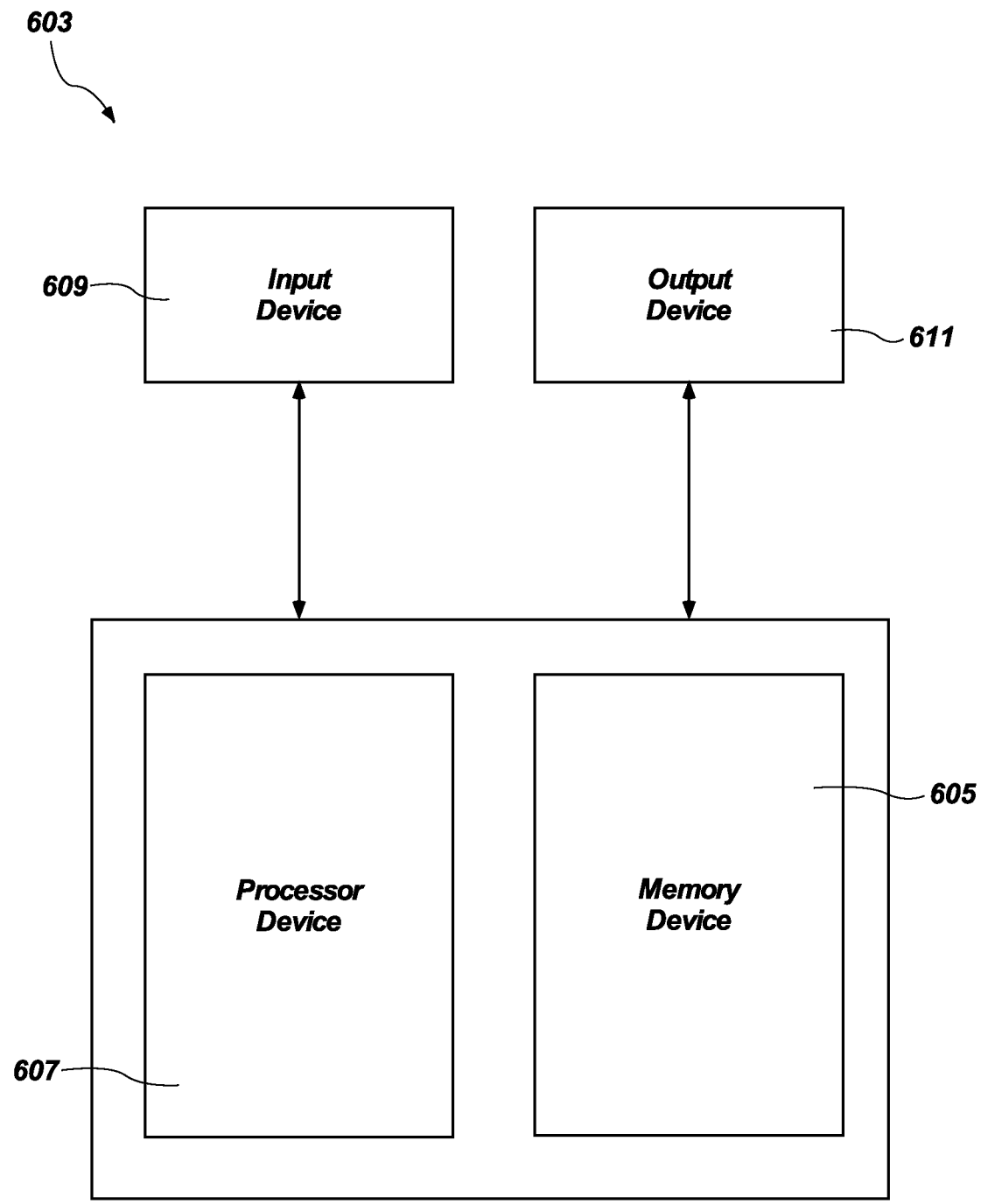
FIG. 6 is a block diagram of an electronic system, in accordance with embodiments of the disclosure.

Semiconductor devices (e.g., the semiconductor devices 100, 300, 400, 500) including the electrolyte (e.g., the electrolyte 112, 312, 412, 512) in accordance with embodiments of the disclosure may be used in embodiments of electronic systems of the disclosure. For example, FIG. 6 is a block diagram of an illustrative electronic system 603 according to embodiments of disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 603 includes at least one memory device 605. The memory device 605 may include, for example, an embodiment of a semiconductor device previously described herein (e.g., semiconductor devices 100, 300, 400, 500), wherein electrolyte (e.g., the electrolyte 112, 312, 412, 512) comprise a material including cations configured to move from a first end to a second end thereof responsive to exposure to an electrical field. The electrolyte may be located directly between a dielectric material (e.g., the dielectric materials 110, 310, 410, 510) and an electrode (e.g., the electrodes 114, 314, 414, 514).

The electronic system 603 may further include at least one electronic signal processor device 607 (often referred to as a "microprocessor"). The electronic signal processor device 607 may, optionally, include an embodiment of a semiconductor device previously described herein (e.g., the semiconductor devices 100, 300, 400, 500). The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607.

Figure 7:
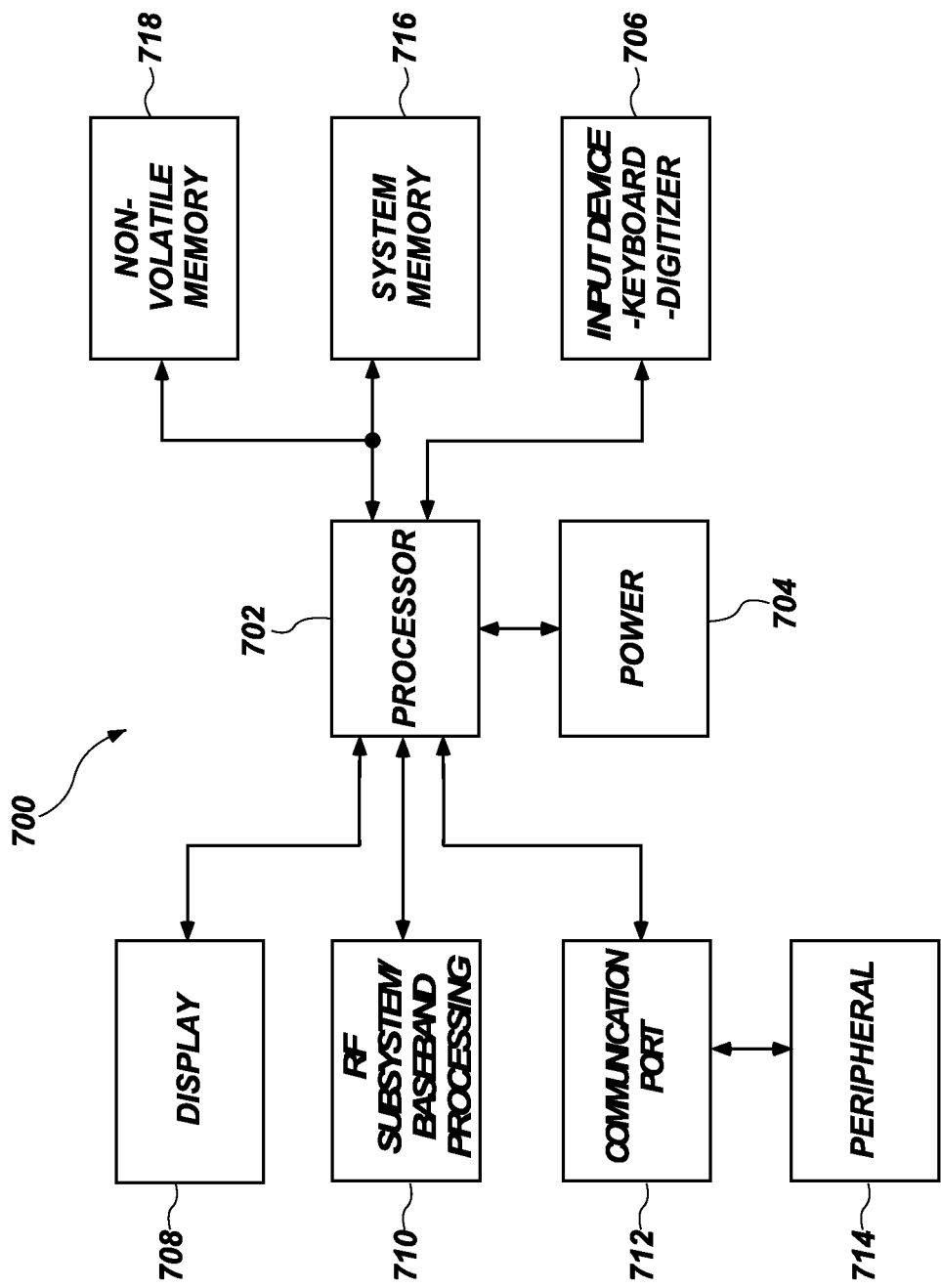
FIG. 7 is a processor-based system, in accordance with embodiments of the disclosure.

With reference to FIG. 7, depicted is a processor-based system 700. The processor-based system 700 may include various electronic devices manufactured in accordance with embodiments of the present disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 and other subcomponents of the processor-based system 700 may include semiconductor devices (e.g., semiconductor devices 100, 300, 400, 500) manufactured in accordance with embodiments of the present disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other devices may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include semiconductor devices, such as the semiconductor devices (e.g., the semiconductor devices 100, 300, 400, 500) described above, or a combination thereof.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and flash memory to be used in conjunction with the system memory 716. The size of the non-volatile memory 718 is typically selected to be just large enough to store any necessary operating system, application programs, and fixed data. Additionally, the non-volatile memory 718 may include a high-capacity memory such as disk drive memory, such as a hybrid-drive including resistive memory or other types of non-volatile solid-state memory, for example. The non-volatile memory 718 may include semiconductor devices, such as the semiconductor devices (e.g., the semiconductor devices 100, 300, 400, 500) described above, or a combination thereof.

Thus, in accordance with embodiments of the disclosure, an electronic system comprises at least one processor device operably coupled to at least one input device and at least one output device, and a semiconductor device operably coupled to the at least one processor device. The semiconductor device comprises at least one transistor comprising a channel region between a source region and a drain region, a dielectric material adjacent to at least the channel region, and an electrolyte adjacent to the dielectric material and between the dielectric material and an electrode.

The following example serves to explain embodiments of the disclosure in more detail. These examples are not to be construed as being exhaustive, exclusive or otherwise limiting as to the scope of this disclosure.

Example

Figure 8:
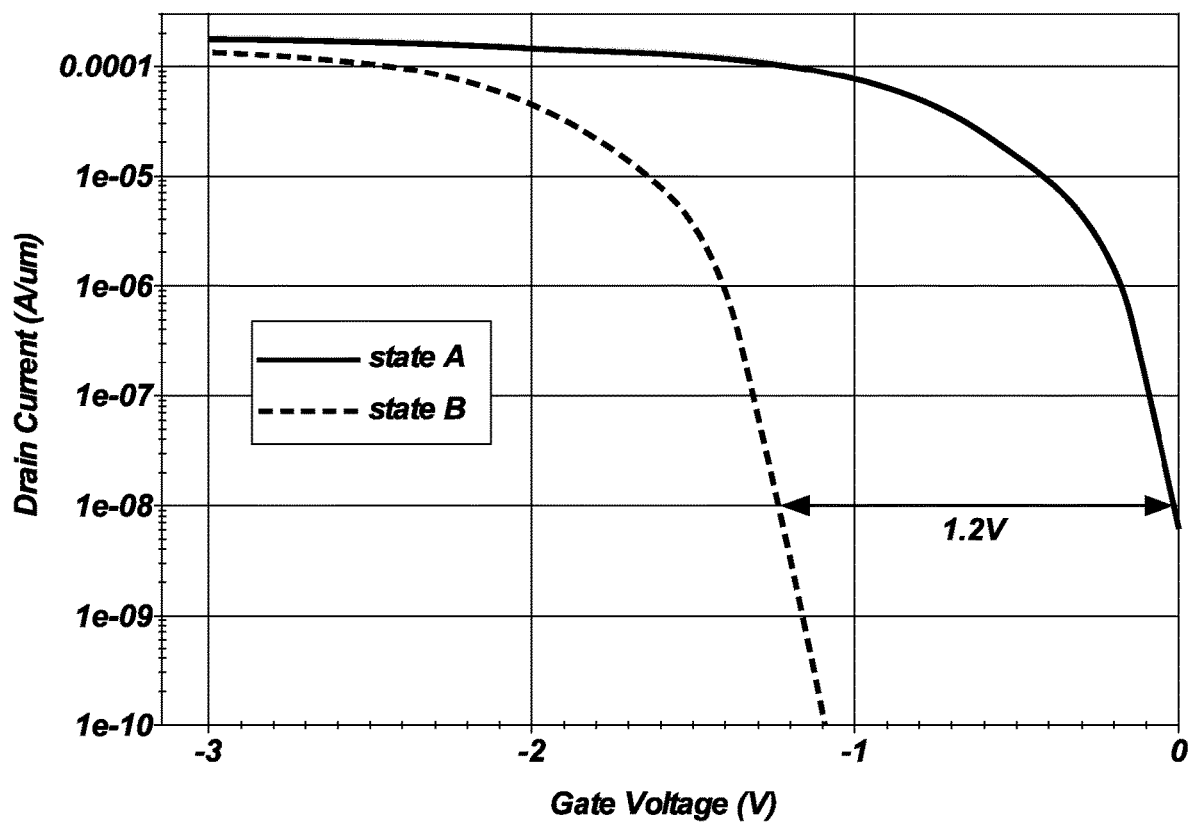
FIG. 8 is a graph illustrating the voltage at the electrode as a function of the current at the drain region.

A transistor comprising a source region, a drain region, and a channel region between the source region and the drain region was formed. The source region and the drain region were doped with an N-type conductivity material and the channel region was doped with a P-type conductivity material. A dielectric material (e.g., a gate dielectric material) comprising hafnium dioxide was formed adjacent to the channel region. An electrolyte comprising cobalt phthalocyanine crown ether was formed adjacent to the dielectric material. An electrode (e.g., a gate electrode) was formed adjacent to the electrolyte. The electrolyte was directly between and contacting the dielectric material and the electrode. FIG. 8 is graph illustrating the voltage at the electrode (gate voltage) as a function of the current at the drain region (drain current). As illustrated in FIG. 8, a read window ($V_{rcc}$) of the transistor was about 1.17 V. Accordingly, since the transistor exhibits different electrical properties based on the location of the cations in the electrolyte, the transistor may be used to store a logic state of a memory cell.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A transistor, comprising:
a channel region between a source region and a drain region, wherein each of the channel region, the source region, and the drain region is directly overlying and contacting a semiconductor base material, wherein surfaces of the channel region, the source region, and the drain region are in contact with the base material and coplanar with each other;
a dielectric material overlying and in contact with the channel region, the dielectric material having a dielectric constant greater than about 5.0; and
an electrolyte between the dielectric material and an electrode, wherein the electrolyte directly contacts the dielectric material and the electrode, the electrolyte comprising cations configured to move between an interface between the dielectric material and the electrolyte and an interface between the electrode and the electrolyte responsive to application of a voltage to the electrode, the dielectric material not contacting the electrode and spaced from the electrode by the electrolyte, the channel region not contacting the electrolyte and spaced from the electrolyte by the dielectric material, wherein sidewalls of the electrolyte are coplanar with sidewalls of the dielectric material and sidewalls of the electrode.

2. The transistor of claim 1, wherein the electrolyte comprises lithium ions.

3. The transistor of claim 1, wherein the electrolyte comprises cobalt.

4. The transistor of claim 1, wherein the electrolyte comprises cobalt crown ether phthalocyanine.

5. The transistor of claim 1, wherein the electrolyte has a thickness within a range from about 4 Å to about 10 Å.

6. The transistor of claim 1, wherein the electrolyte is located on opposing sides of the channel region, the channel region and the dielectric material laterally between portions of the electrolyte.

7. The transistor of claim 1, wherein the electrolyte substantially surrounds the dielectric material.

8. An electronic system, comprising:
an input device;
an output device;
at least one processor device operably coupled to the at least one input device and the at least one output device; and
a semiconductor device operably coupled to the at least one processor device, the semiconductor device comprising:
at least one vertical transistor vertically extending above a base material, the at least one vertical transistor comprising a channel region between a source region and a drain region, wherein the channel region is vertically oriented with respect to a major surface of the base material, the channel region comprising a laterally central portion of the at least one vertical transistor;
a dielectric material laterally adjacent to and surrounding at least the channel region and contacting the source region and the drain region;
an electrolyte laterally adjacent to and surrounding the dielectric material, the electrolyte having a greater vertical dimension than a lateral dimension, the dielectric material directly contacting laterally opposing sides of each of the source region, the drain region, and the channel region; and an electrode laterally adjacent to and surrounding the electrolyte, the electrolyte directly between and contacting the dielectric material and the electrode, the dielectric material spaced from the electrode by the electrolyte.

9. The electronic system of claim 8, wherein the electrolyte comprises a crown ether.

10. The electronic system of claim 8, wherein the electrolyte comprises lithium ions.

11. A semiconductor device comprising at least one transistor, the at least one transistor consisting of:
a channel region between a source and a drain, each of the channel region, the source, and the drain directly overlying and contacting a semiconductor base material;
a dielectric material directly contacting the channel region;
an electrolyte comprising a crown ether and directly contacting the dielectric material, the dielectric material spacing the electrolyte from the channel region; and
an electrode directly contacting the electrolyte, the dielectric material not contacting the electrode and spaced from the electrode by the electrolyte, the dielectric material exhibiting a band gap greater than about 4.0 eV, and the channel region not contacting the electrolyte and spaced from the electrolyte by the dielectric material.

12. The semiconductor device of claim 11, wherein the channel region comprises a two-dimensional crystalline material.

13. A method of forming a semiconductor device, the method comprising:
forming a channel region between a source region and a drain region directly overlying and in contact with a semiconductor base material, surfaces of the channel region, the source region, and the drain region in contact with the base material and coplanar with each other;
forming a dielectric material having a dielectric constant greater than about 5.0, the dielectric material overlying and in contact with the channel region;
forming an electrolyte adjacent to the dielectric material; and
forming an electrode adjacent to the electrolyte and spaced from the dielectric material by the electrolyte, the electrolyte comprising cations configured to move between an interface between the dielectric material and the electrolyte and an interface between the electrode and the electrolyte responsive to application of a voltage to the electrode, the electrolyte directly contacting the dielectric material and the electrode, the dielectric material not contacting the electrode and spaced from the electrode by the electrolyte, the channel region not contacting the electrolyte and spaced from the electrolyte by the dielectric material, sidewalls of the electrolyte coplanar with sidewalls of the dielectric material and sidewalls of the electrode.

14. The method of claim 13, wherein forming an electrolyte comprises forming the electrolyte spaced from the channel region by the dielectric material.

15. The method of claim 13, wherein forming a dielectric material comprises forming a dielectric material having a band gap greater than about 4.0 eV.

16. A method of operating a semiconductor device, the method comprising:
applying a voltage to an electrode of a transistor comprising:
a channel region between a source region and a drain region, wherein each of the channel region, the source region, and the drain region is directly overlying and contacting a semiconductor base material, wherein surfaces of the channel region, the source region, and the drain region are coplanar with each other;
a dielectric material overlying and in contact with the channel region, the dielectric material having a dielectric constant greater than about 5.0; and
an electrolyte directly between the dielectric material and an electrode, wherein the electrolyte directly contacts the dielectric material and the electrode, the electrolyte comprising cations configured to move between an interface between the dielectric material and the electrolyte and an interface between the electrode and the electrolyte responsive to application of a voltage to the electrode, the dielectric material not contacting the electrode and spaced from the electrode by the electrolyte, the channel region not contacting the electrolyte and spaced from the electrolyte by the dielectric material, wherein sidewalls of the electrolyte are coplanar with sidewalls of the dielectric material and sidewalls of the electrode,
wherein applying the voltage moves the cations to one of the interface between the electrode and the electrolyte or the interface between the dielectric material and the electrolyte; and
determining at least one electrical property of the channel region.

17. The semiconductor device of claim 11, wherein the channel region is laterally oriented with respect to the semiconductor base material.

18. The semiconductor device of claim 11, wherein the channel region is vertically oriented with respect to the semiconductor base material.

19. The electronic system of claim 8, wherein the electrolyte contacts each of the dielectric material and the electrode.

20. The electronic system of claim 8, wherein the electrolyte comprises one of 3-crown-1 ether, 6-crown-2 ether, 9-crown-3 ether, 12-crown-4 ether, 15-crown-5 ether, 18-crown-6-ether, or 21-crown-7 ether.

21. The transistor of claim 1, wherein:
the channel region directly contacts the base material; and
the dielectric directly contacts the channel region.

* * * * *

UNITED STATES PATENT AND TRADEMARK OFFICE
CERTIFICATE OF CORRECTION

PATENT NO.       : 11,257,962 B2                              Page 1 of 1
APPLICATION NO.  : 16/401844
DATED            : February 22, 2022
INVENTOR(S)      : Yunfei Gao et al.

It is certified that error appears in the above-identified patent and that said Letters Patent is hereby corrected as shown below:

In the Specification
Column 4,    Line 33,    change "$Mg^{2+}$, $Sr^{2+}$)" to --$Mg^{2+}$, $Ca^{2+}$, $Sr^{2+}$)--

Signed and Sealed this
Twenty-ninth Day of March, 2022

Drew Hirshfeld
*Performing the Functions and Duties of the*
*Under Secretary of Commerce for Intellectual Property and*
*Director of the United States Patent and Trademark Office*